(12) United States Patent
Park et al.

(10) Patent No.: US 10,395,834 B2
(45) Date of Patent: Aug. 27, 2019

(54) MULTILAYER CAPACITOR AND BOARD HAVING THE SAME

(71) Applicant: SAMSUNG ELECTRO-MECHANICS CO., LTD., Suwon-si, Gyeonggi-do (KR)

(72) Inventors: Heung Kil Park, Suwon-si (KR); Jong Hwan Park, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/407,456

(22) Filed: Jan. 17, 2017

(65) Prior Publication Data
US 2017/0352482 A1    Dec. 7, 2017

(30) Foreign Application Priority Data
Jun. 3, 2016  (KR) .................. 10-2016-0069641

(51) Int. Cl.
*H01G 4/30* (2006.01)
*H01G 4/232* (2006.01)
(Continued)

(52) U.S. Cl.
CPC .............. *H01G 4/30* (2013.01); *H01G 4/232* (2013.01); *H05K 1/111* (2013.01); *H05K 1/181* (2013.01);
(Continued)

(58) Field of Classification Search
CPC ..................................................... H01G 4/30
See application file for complete search history.

(56) References Cited

U.S. PATENT DOCUMENTS

| 2005/0012200 A1 | 1/2005 | Sawada et al. |
| 2010/0025075 A1* | 2/2010 | Feichtinger ............ H01C 1/142 174/126.1 |

(Continued)

FOREIGN PATENT DOCUMENTS

| JP | 2004296940 A | * 10/2004 |
| JP | 2005-051226 A | 2/2005 |

(Continued)

OTHER PUBLICATIONS

Office Action issued in corresponding Korean Patent Application No. 10-2016-0069641, dated May 10, 2017 with English language translation.

(Continued)

*Primary Examiner* — Eric W Thomas
(74) *Attorney, Agent, or Firm* — Morgan, Lewis & Bockius LLP

(57) ABSTRACT

A multilayer capacitor includes a ceramic body including a plurality of dielectric layers stacked to be disposed perpendicularly to a mounting surface of the ceramic body, and first and second internal electrodes alternately disposed, with respective dielectric layers interposed therebetween, the first and second internal electrodes being exposed to the mounting surface of the ceramic body and first and second end surfaces of the ceramic body opposing each other, respectively; first and second external electrodes disposed on the ceramic body to be connected to the first and second internal electrodes, respectively; and an insulating layer disposed on the mounting surface of the ceramic body and covering portions of the first and second internal electrodes exposed to the mounting surface but not in contact with the first and second external electrodes.

9 Claims, 15 Drawing Sheets

(51) Int. Cl.
*H05K 1/11* (2006.01)
*H05K 1/18* (2006.01)

(52) U.S. Cl.
CPC ... *H05K 2201/10015* (2013.01); *Y02P 70/611* (2015.11)

(56) References Cited

U.S. PATENT DOCUMENTS

| | | |
|---|---|---|
| 2011/0007449 A1 | 1/2011 | Seo et al. |
| 2012/0147516 A1 | 6/2012 | Kim et al. |
| 2013/0058006 A1 | 3/2013 | Kim |
| 2014/0177128 A1 | 6/2014 | Kim |
| 2014/0192453 A1* | 7/2014 | Hong ............... H01G 4/008 361/301.4 |
| 2014/0362492 A1 | 12/2014 | Lee et al. |
| 2016/0381802 A1* | 12/2016 | Taniguchi ......... H01G 4/008 174/260 |

FOREIGN PATENT DOCUMENTS

| | | |
|---|---|---|
| JP | 2015-026721 A | 2/2015 |
| KR | 10-2011-0005072 A | 1/2011 |
| KR | 10-2012-0031235 A | 3/2012 |
| KR | 10-1141457 B1 | 5/2012 |
| KR | 10-2013-0025595 A | 3/2013 |
| KR | 10-1388690 B1 | 4/2014 |
| KR | 10-2014-0142848 A | 12/2014 |
| WO | 2011/002982 A2 | 1/2011 |

OTHER PUBLICATIONS

Korean Office Action issued in corresponding Korean Patent Application No. 10-2016-0069641, dated Nov. 16, 2017, with English Translation.

* cited by examiner

MULTILAYER CAPACITOR AND BOARD HAVING THE SAME

CROSS-REFERENCE TO RELATED APPLICATION(S)

This application claims the benefit of priority to Korean Patent Application No. 10-2016-0069641, filed on Jun. 3, 2016 in the Korean Intellectual Property Office, the entire disclosure of which is incorporated herein by reference.

TECHNICAL FIELD

The present disclosure relates to a multilayer capacitor and a board having the same.

BACKGROUND

A large-scale integration (LSI) circuit is a representative component of an application processor of a smartphone.

As current consumption has increased, in accordance with the recent trend toward multifunctionality and high integration in LSI circuits, and overcurrents are rapidly generated in a power supply circuit by an increase in a driving frequency, an allowable source voltage value ensuring the smooth operation of a system may be decreased, such that resilience of the system against power noise may be deteriorated.

In order to increase system stability in a high performance LSI circuit, there is a need to design power impedance to be low in a wide frequency band, and power impedance is affected by the design of a board and a decoupling capacitor.

Thus, in order to decrease the power impedance, there is a need to decrease equivalent series inductance (ESL) of the decoupling capacitor, as well as a need to conduct research on how to ensure high capacitance of the decoupling capacitor.

SUMMARY

An aspect of the present disclosure may provide a multilayer capacitor in which equivalent series inductance (ESL) may be decreased and capacitance of the capacitor may be increased by decreasing a cross-sectional area of a current path, and a board having the same.

According to an aspect of the present disclosure, a multilayer capacitor comprises a ceramic body including a plurality of dielectric layers stacked to be disposed perpendicularly to a mounting surface of the ceramic body, and first and second internal electrodes alternately disposed, with respective dielectric layers interposed therebetween, the first and second internal electrodes being exposed to the mounting surface of the ceramic body and first and second end surfaces of the ceramic body opposing each other, respectively; first and second external electrodes disposed on the ceramic body to be connected to exposed portions of the first and second internal electrodes, respectively; and an insulating layer formed on the mounting surface of the ceramic body to cover portions of the first and second internal electrodes exposed to the mounting surface but not in contact with the first and second external electrodes, and a board having the same, may be provided.

BRIEF DESCRIPTION OF THE DRAWINGS

The above and other aspects, features, and advantages of the present disclosure will be more clearly understood from the following detailed description when taken in conjunction with the accompanying drawings, in which.

DETAILED DESCRIPTION

Hereinafter, exemplary embodiments of the present disclosure will be described in detail with reference to the accompanying drawings.

Directions of a hexahedron will be defined in order to clearly describe exemplary embodiments in the present disclosure. X, Y, and Z, illustrated in FIG. 1, refer to a length direction, a width direction, and a thickness direction, respectively. Here, the width direction may be the same as a stacking direction in which dielectric layers are stacked.

Multilayer Capacitor

Figure 1:
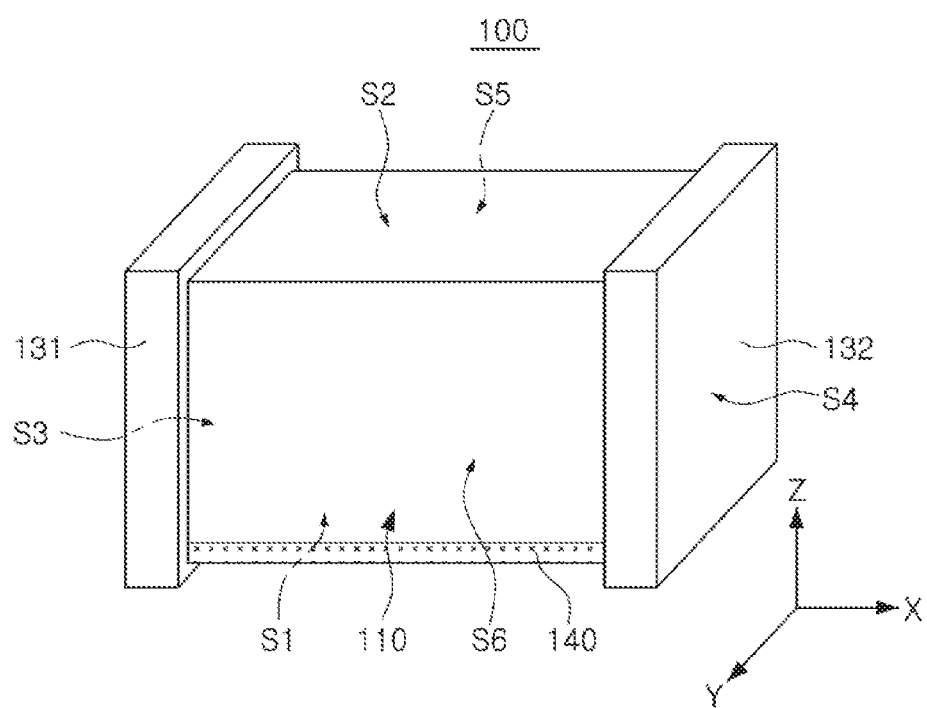
FIG. 1 is a perspective diagram schematically illustrating a multilayer capacitor according to an exemplary embodiment in the present disclosure.
Figure 2:
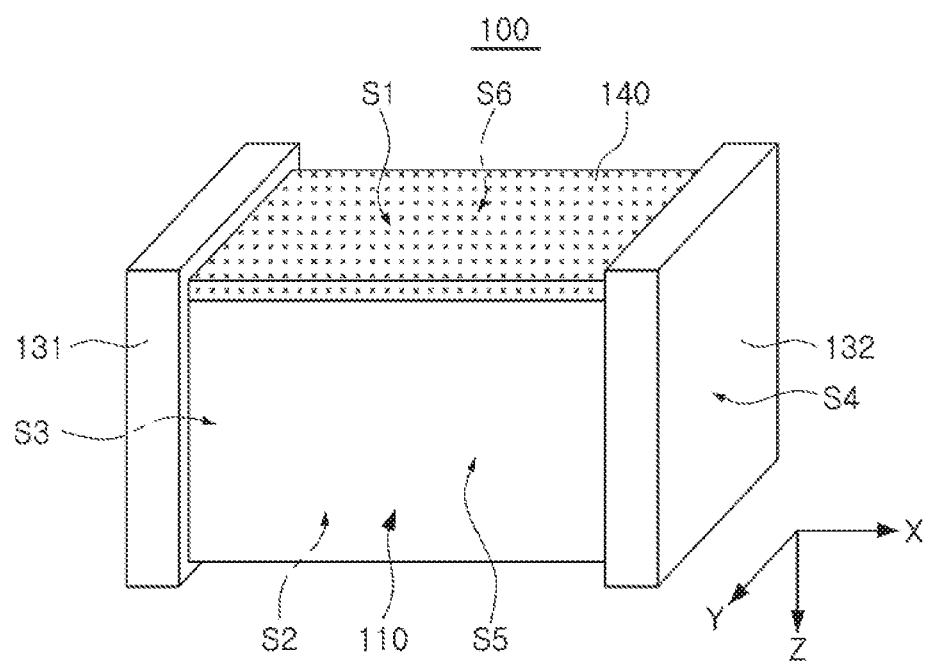
FIG. 2 is a perspective diagram illustrating the multilayer capacitor of FIG. 1 in an overturned state.
Figure 3:
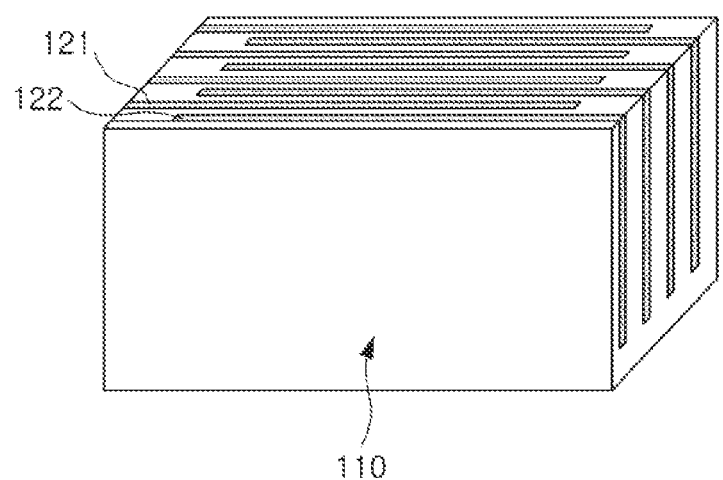
FIG. 3 is a perspective diagram illustrating the multilayer capacitor of FIG. 2 in a state in which external electrodes and an insulating layer are removed.
Figure 4:
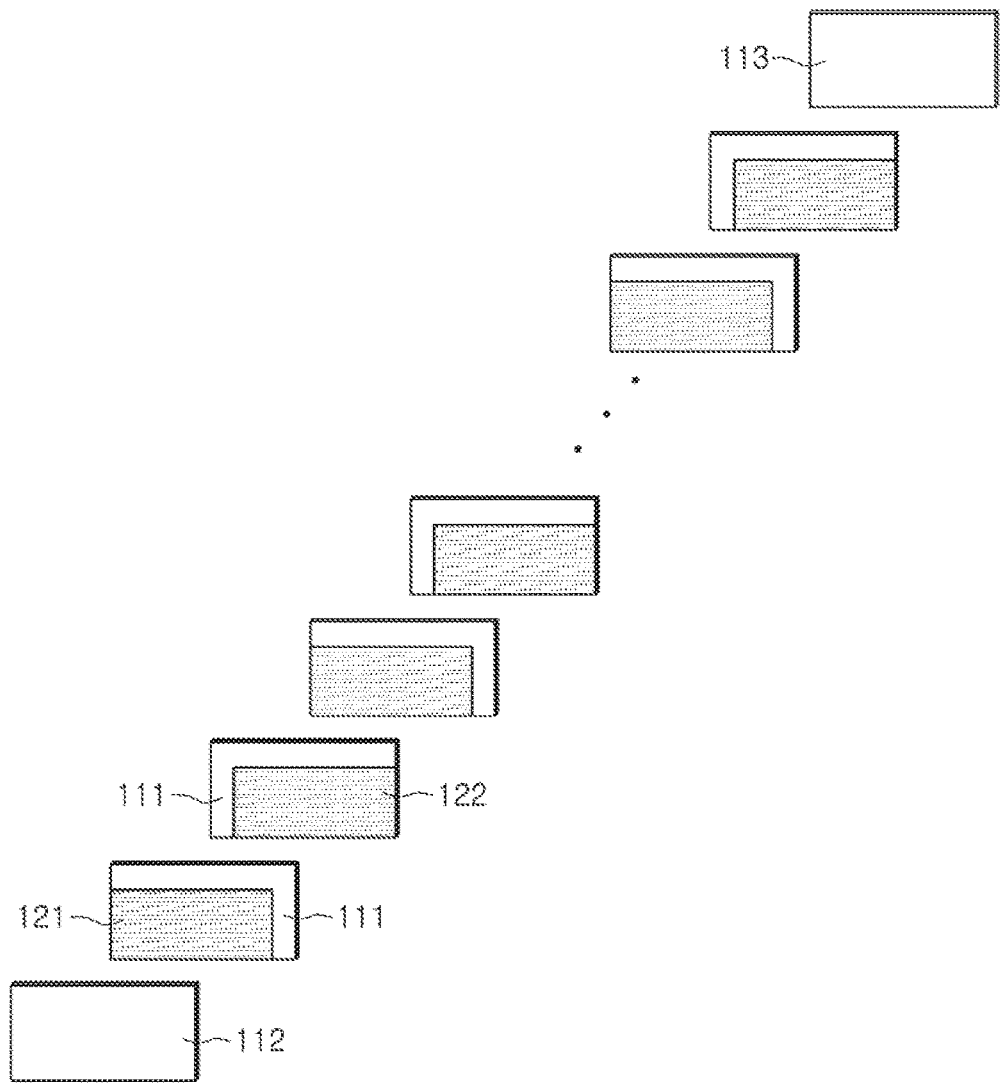
FIG. 4 is a separated perspective diagram illustrating a stacking structure of first and second internal electrodes in the multilayer capacitor of FIG. 1.
Figure 5:
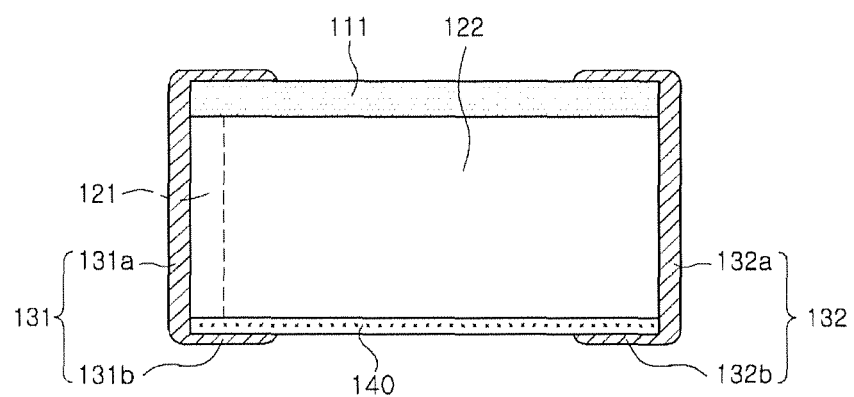
FIG. 5 is a cross-sectional diagram of FIG. 1.

FIG. 1 is a perspective diagram schematically illustrating a multilayer capacitor according to an exemplary embodiment in the present disclosure, FIG. 2 is a perspective diagram illustrating the multilayer capacitor of FIG. 1 in an overturned state, FIG. 3 is a perspective diagram illustrating the multilayer capacitor of FIG. 2 in a state in which external electrodes and an insulating layer are removed, FIG. 4 is a separated perspective diagram illustrating a stacking structure of first and second internal electrodes in the multilayer capacitor of FIG. 1, and FIG. 5 is a cross-sectional diagram of FIG. 1. Referring to FIGS. 1 through 5, a multilayer capacitor 100, according to the present exemplary embodiment, may include a ceramic body 110 in which a plurality of dielectric layers 111 are stacked and a plurality of first and second internal electrodes 121 and 122 are included, as well as first and second external electrodes 131 and 132, and an insulating layer 140.

The ceramic body 110 may have first and second surfaces S1 and S2 opposing each other in a Z direction, third and fourth surfaces S3 and S4 connecting the first and second surfaces S1 and S2 to each other and opposing each other in an X direction, and fifth and sixth surfaces S5 and S6 opposing each other in a Y direction.

Hereinafter, in the present exemplary embodiment, a description will be provided on the assumption that a mounted surface of the multilayer capacitor 100 is the first surface S1 of the ceramic body 110.

The ceramic body 110 as described above may be formed by stacking the plurality of dielectric layers 111 in the Y direction perpendicular to the first surface S1 thereof, and then sintering the stacked dielectric layers 111. A shape thereof is not particularly limited, but may be a hexahedral shape, as illustrated in the accompanying drawings.

The plurality of dielectric layers 111 configuring the ceramic body 110 may be in a sintered state, and adjacent dielectric layers 111 may be integrated with each other so that boundaries therebetween are not readily apparent without a scanning electron microscope (SEM).

In addition, if necessary, the dielectric layer 111 may further contain a ceramic additive, an organic solvent, a plasticizer, a binder, a dispersant, and the like, in addition to a ceramic powder.

The ceramic body 110 as described above may include an active layer having a plurality of internal electrodes as apart contributing to forming a capacitance of the capacitor, and covers 112 and 113, disposed on both sides of the active layer as margin portions in the Y direction, respectively.

The active layer may be formed by alternately stacking the plurality of first and second internal electrodes 121 and 122 in the Y direction, with respective dielectric layers 111 interposed therebetween.

The covers 112 and 113 may have the same material and configuration as those of the dielectric layer 111 except that internal electrodes are not included therein.

In addition, these covers 112 and 113 may be formed by stacking a single or two or more dielectric layers on both sides of outermost internal electrodes of the active layer, respectively, and may serve to prevent the first and second internal electrodes 121 and 122 from being damaged by physical or chemical stress.

The first external electrode 131 may include a first base portion 131a formed on the third surface S3 of the ceramic body 110 in the X direction, and a first band portion 131b extended from the first base portion 131a to a portion of the first surface S1 of the ceramic body 110.

Furthermore, the first band portion 131b may extend to a portion of the second surface S2 of the ceramic body 110 and to portions of the fifth and sixth surfaces S5 and S6 of the ceramic body 110 in the Y direction, respectively.

The second external electrode 132, which is an electrode applied with electricity having a different polarity from that applied to the first external electrode 131, may include a second base portion 132a, formed on the fourth surface S4 of the ceramic body 110 in the X direction, and a second band portion 132b, extended from the second base portion 132a to a portion of the first surface S1 of the ceramic body 110.

Furthermore, the second band portion 132b may extend to a portion of the second surface S2 of the ceramic body 110 and to portions of the fifth and sixth surfaces S5 and S6 of the ceramic body 110 in the Y direction, respectively.

In addition, first and second plating layers (not illustrated) may be formed on the first and second external electrodes 131 and 132, respectively.

The first and second plating layers may include first and second nickel (Ni) plating layers, each formed on the first and second external electrodes 131 and 132, and first and second tin (Sn) plating layers, each formed on the first and second nickel plating layers.

The first and second internal electrodes 121 and 122, which are electrodes applied with different polarities, may be formed in the ceramic body 110 and alternately disposed to face each other, with respective dielectric layers 111 interposed therebetween.

In this case, the first and second internal electrodes 121 and 122 may be electrically insulated from each other by the dielectric layer 111 disposed therebetween.

In addition, a material forming the first and second internal electrodes 121 and 122 is not particularly limited. For example, the first and second internal electrodes 121 and 122 may be formed using a conductive paste formed of one or more noble metal materials such as palladium (Pd), a palladium-silver (Pd-Ag) alloy, or the like, nickel (Ni), and copper (Cu).

As a printing method of the conductive paste, a screen printing method, a gravure printing method, or the like, may be used, but the printing method is not limited thereto.

The first internal electrode 121 may be formed to be exposed to the first and third surfaces S1 and S3 of the ceramic body 110.

In the present exemplary embodiment, the first internal electrode 121 may be formed to be exposed to an edge of the ceramic body 110 contacting the first and third surfaces S1 and S3 of the ceramic body 110 in an X-Z direction.

Here, the first band portion 131b of the first external electrode 131 may be connected to a portion of the first internal electrode 121 exposed to the first surface S1 of the ceramic body 110, to thereby be electrically connected thereto, and the first base portion 131a of the first external electrode 131 may be connected to a portion of the first internal electrode 121 exposed to the third surface S3 of the ceramic body 110, to thereby be electrically connected thereto.

Further, the first band portion 131b of the first external electrode 131 may be formed to have a length shorter than that of the portion of the first internal electrode 121 exposed to the first surface S1 of the ceramic body 110.

Therefore, the first internal electrode 121 has a structure in which the portion of the first internal electrode 121 exposed to the first surface S1 of the ceramic body 110 is not partially covered by the first band portion 131b of the first external electrode 131 but is partially exposed to the first surface S1 of the ceramic body 110.

The second internal electrode 122 may be formed to be exposed to the first and fourth surfaces S1 and S4 of the ceramic body 110.

In the present exemplary embodiment, the second internal electrode 122 may be formed to be exposed to an edge of the ceramic body 110 contacting the first and fourth surfaces S1 and S4 of the ceramic body 110 in the X-Z direction.

Here, the second band portion 132b of the second external electrode 132 may be connected to a portion of the second internal electrode 122 exposed to the first surface S1 of the ceramic body 110, to thereby be electrically connected thereto, and the second base portion 132a of the second external electrode 132 may be connected to a portion of the second internal electrode 122 exposed to the fourth surface S4 of the ceramic body 110, to thereby be electrically connected thereto.

Further, the second band portion 132b of the second external electrode 132 may be formed to have a length shorter than that of the portion of the second internal electrode 122 exposed to the first surface S1 of the ceramic body 110.

Therefore, the second internal electrode 122 has a structure in which the portion of the second internal electrode 122 exposed to the first surface S1 of the ceramic body 110 is not partially covered by the second band portion 132b of the second external electrode 132 but is partially exposed to the first surface S1 of the ceramic body 110.

In the present exemplary embodiment, since the first and second internal electrodes 121 and 122 are expanded, to be exposed to the first surface S1 of the ceramic body 110, a cutting margin of the ceramic body may be decreased, and an overlapping area between the first and second internal electrodes 121 and 122 may be increased, such that the capacitance of the multilayer capacitor may be increased.

The insulating layer 140 may be formed on the first surface S1 of the ceramic body 110, and may serve to cover and insulate the portions of the first and second internal electrodes 121 and 122 which are not covered by the first and second band portions 131b and 132b of the first and second external electrodes 131 and 132, respectively, but are exposed to the first surface S1 of the ceramic body 110 as they are.

The insulating layer 140 as described above may be formed of one of an epoxy and phenol or ceramic slurry, but is not limited thereto.

Here, the insulating layer 140 may be formed of a material, for example, a ceramic material capable of being easily visually distinguished, or the like, so that directionality of a multilayer body may be easily confirmed by a worker.

Further, the insulating layer 140 may extend to portions of the third and fourth surfaces S3 and S4 of the ceramic body 110 in the X direction and to portions of the fifth and sixth surfaces S5 and S6 of the ceramic body 110 in the Y direction.

The insulating layer 140 may be formed to have a length shorter than that of the ceramic body 110, and may be disposed to be spaced apart from the third and fourth surfaces S3 and S4 of the ceramic body 110 in the X direction.

Further, a thickness of the insulating layer 140 may be 10 μm or less.

In addition, a distance between the first or second internal electrode 121 or 122 and the second surface S2 of the ceramic body 110, that is, a thickness of a margin, may be thicker than a thickness of the insulating layer 140.

In the present exemplary embodiment, the first and second external electrodes 131 and 132 may be formed so that the first and second band portions 131b and 132b partially cover both end portions of the insulating layer 140, respectively, to overlap each other.

Therefore, the insulating layer 140 may further improve an effect of preventing problems such as a short-circuit between the internal electrodes, deterioration of moisture resistance characteristics, or a short-circuit caused by external foreign materials.

Modified Exemplary Embodiment

Figure 6:
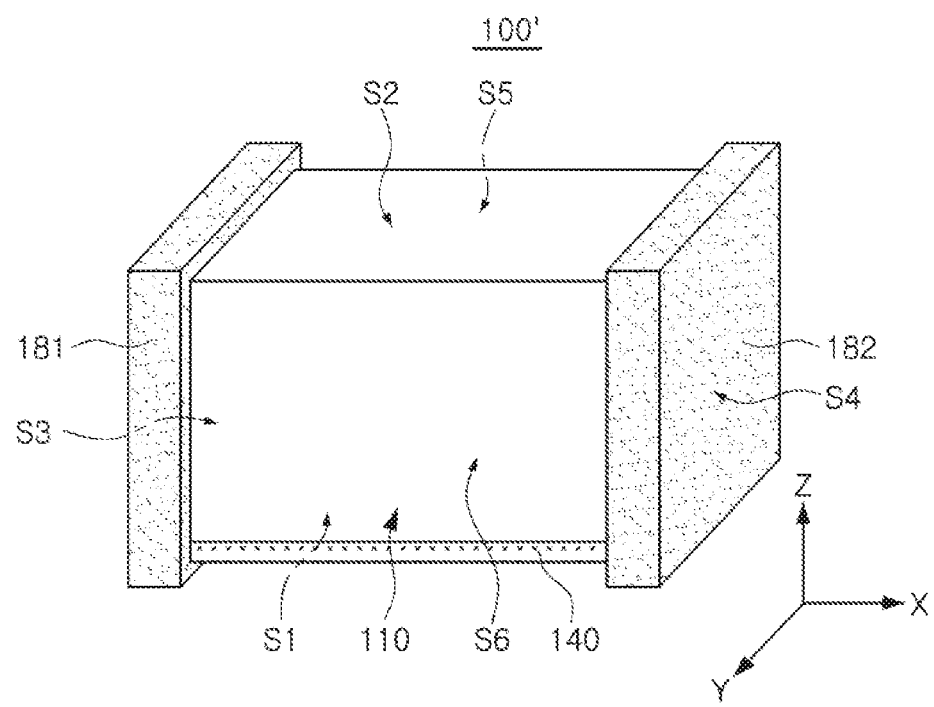
FIG. 6 is a perspective diagram schematically illustrating a multilayer capacitor according to another exemplary embodiment in the present disclosure.
Figure 7:
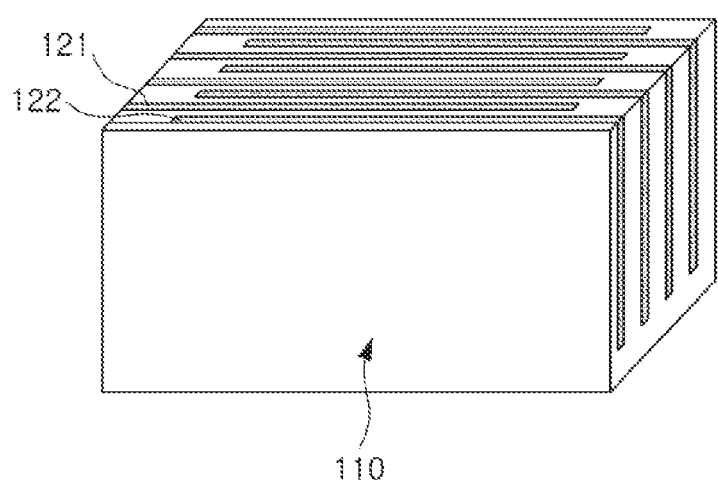
FIG. 7 is a perspective diagram illustrating a ceramic body of FIG. 6 in an overturned state.
Figure 8:
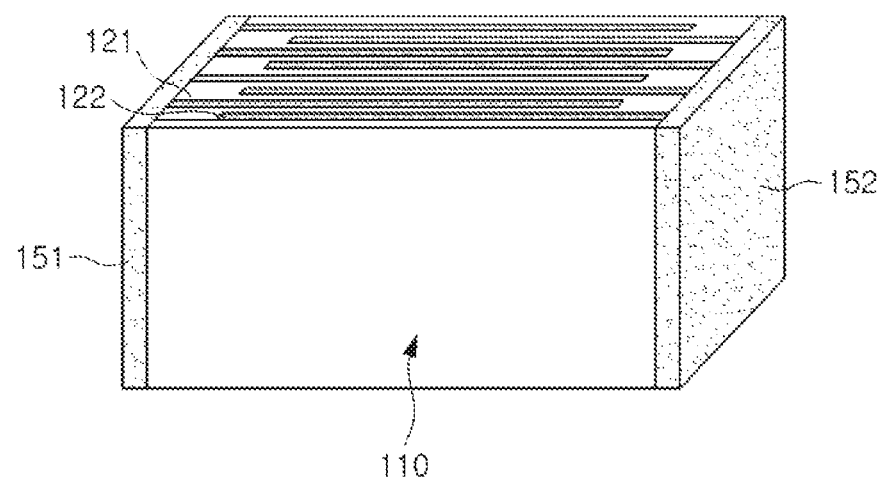
FIG. 8 is a perspective diagram illustrating a base electrode formed on the ceramic body of FIG. 6.
Figure 9:
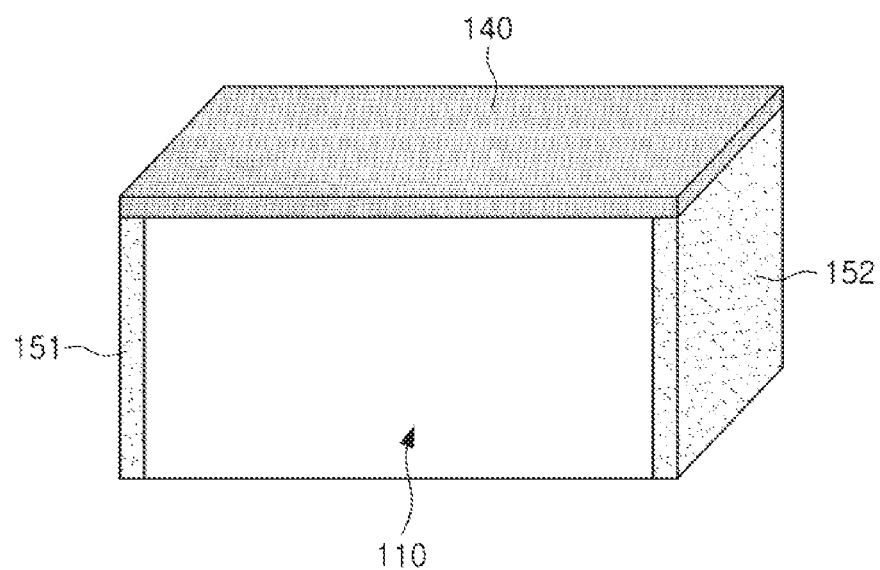
FIG. 9 is a perspective diagram illustrating an insulating layer further formed on the ceramic body of FIG. 8.
Figure 10:
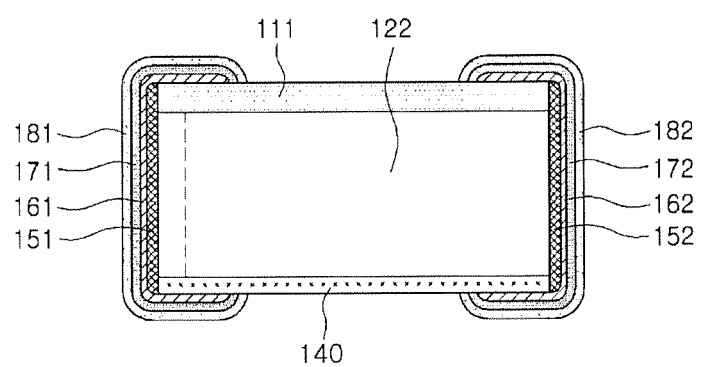
FIG. 10 is a cross-sectional diagram of FIG. 6.

FIG. 6 is a perspective diagram schematically illustrating a multilayer capacitor according to another exemplary embodiment in the present disclosure, FIG. 7 is a perspective diagram illustrating a ceramic body of FIG. 6 in an overturned state, FIG. 8 is a perspective diagram illustrating a base electrode formed on the ceramic body of FIG. 6, FIG. 9 is a perspective diagram illustrating an insulating layer further formed on the ceramic body of FIG. 8, and FIG. 10 is a cross-sectional diagram of FIG. 6.

Here, since structures of first and second internal electrodes 121 and 122 and an insulating layer 140 are similar to those in the above-mentioned exemplary embodiment, a detailed description thereof will be omitted, in order to avoid overlapping descriptions, while external electrodes having a different structure from that in the above-mentioned exemplary embodiment will be illustrated and described in detail with reference to FIGS. 6 through 10.

First and second external electrodes 181 and 182 of a multilayer capacitor 100', according to the present exemplary embodiment, may include first and second electrode layers 151 and 152, first and second conductive resin layers 161 and 162, and first and second plating layers 171 and 172.

The first and second electrode layers 151 and 152 may contain a conductive metal and glass frit, and may be portions contacting surfaces of the ceramic body 110 that are electrically connected to exposed portions of the first and second internal electrodes 121 and 122 by sintering.

Here, the conductive metal used in the first and second electrode layers 151 and 152 is not particularly limited, as long as the first and second electrode layers 151 and 152 may be electrically connected to the first and second internal electrodes 121 and 122, in order to form the capacitance. For example, the conductive metal may be one or more selected from the group consisting of copper (Cu), nickel (Ni), silver (Ag), and silver-palladium (Ag—Pd).

The first and second conductive resin layers 161 and 162 may be formed to cover the first and second electrode layers 151 and 152, respectively, and may contain a thermosetting resin and a metal as main ingredients.

Here, the metal contained in the first and second conductive resin layers 161 and 162 is not particularly limited, as long as the first and second conductive resin layers may be electrically connected to the first and second electrode layers 151 and 152. For example, the first and second conductive resin layers 161 and 162 may contain one or more selected from the group consisting of silver (Ag), copper (Cu), nickel (Ni), and silver-palladium (Ag—Pd).

The first and second plating layers may be formed to cover the first and second conductive resin layers 161 and 162, respectively, and may sequentially include first and second nickel (Ni) plating layers 171 and 172 and first and second tin (Sn) plating layers 181 and 182, formed on the first and second nickel plating layers 171 and 172, respectively, from the inside to the outside.

Board Having Multilayer Capacitor

Figure 11:
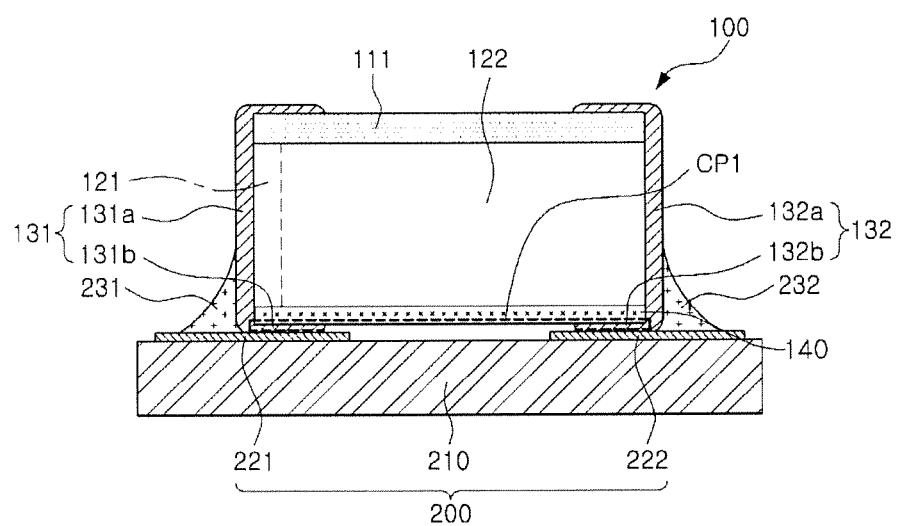
FIG. 11 is a cross-sectional diagram illustrating a circuit board on which the multilayer capacitor of FIG. 1 is mounted.

FIG. 11 is a cross-sectional diagram illustrating a board on which the multilayer capacitor of FIG. 1 is mounted.

Referring to FIG. 11, a board 200 having a multilayer capacitor according to the present exemplary embodiment may include a circuit board 210, on which first and second external electrodes 131 and 132 of the multilayer capacitor 100 are horizontally mounted, and first and second electrode pads 221 and 222, formed on an upper surface of the circuit board 210 to be spaced apart from each other.

Here, the multilayer capacitor 100 may be electrically connected to the circuit board 210 by solders 231 and 232 in a state in which the first and second external electrodes 131 and 132 are positioned to contact the first and second electrode pads 221 and 222, respectively.

Figure 12:
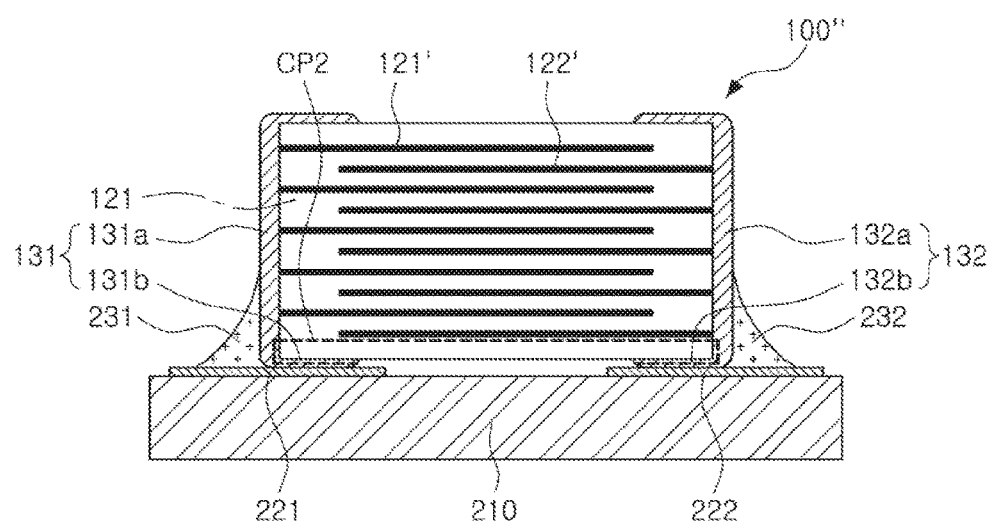
FIG. 12 is a cross-sectional diagram illustrating a circuit board on which a horizontal type multilayer capacitor according to the related art is mounted.

FIG. 12 is a cross-sectional diagram illustrating a circuit board on which a horizontal type multilayer capacitor according to the related art is mounted.

Referring to FIGS. 11 and 12, in the multilayer ceramic capacitor 100, according to the present exemplary embodiment, the first and second internal electrodes 121 and 122 may be exposed to the first surface S1 of the ceramic body 110, the third and fourth surfaces S3 and S4 thereof opposing each other, respectively, and the first and second external electrodes 131 and 132 may contact exposed portions of the first and second internal electrodes 121 and 122 on the first surface S1 of the ceramic body 110 and the third and fourth surfaces S3 and S4 thereof, opposing each other to thereby be electrically connected thereto, respectively.

Therefore, low equivalent series inductance (ESL) characteristics may be significantly improved by decreasing a cross-sectional area of a current path CP1 between the circuit board 210, in which a current flows, and the first and second internal electrodes 121 and 122. In addition, a Q factor value may be increased by improving an effect of removing high-frequency noise, and, at the same time, a defect rate of an internal structure may also be decreased.

On the contrary, in the horizontal type multilayer capacitor 100", according to the related art, first and second internal electrodes 121' and 122' are formed to be alternately exposed to third and fourth surfaces S3 and S4 of a ceramic body 110. Therefore, an area of a current path CP2 is relatively increased as compared to the multilayer capacitor according to the present exemplary embodiment, while the ESL may be increased, a Q factor value may be decreased, and, at the same time, a defect rate of an internal structure may also be increased.

Figure 13:
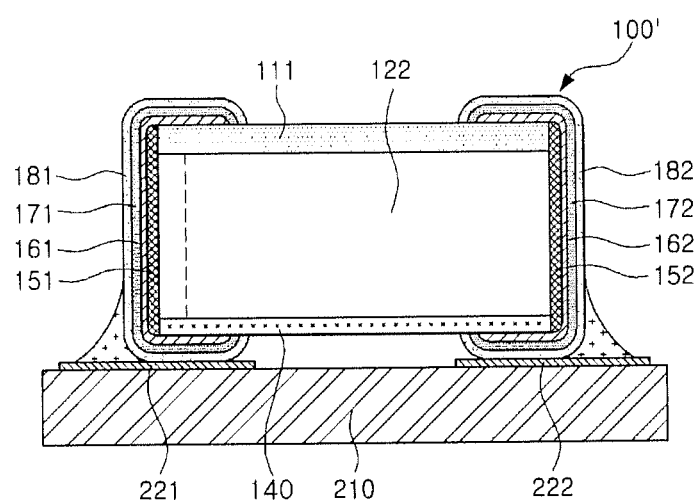
FIG. 13 is a cross-sectional diagram illustrating a circuit board on which the multilayer capacitor of FIG. 6 is mounted.

Although a case in which the multilayer capacitor of FIG. 1 is mounted on the circuit board is illustrated in FIG. 11, a multilayer capacitor according to another exemplary embodiment may also be similarly mounted on the circuit board. For example, the multilayer capacitor of FIG. 6 may be mounted on the circuit board, as illustrated in FIG. 13.

In an LSI power supply, a plurality of decoupling capacitors may be disposed between a voltage regulator and an LSI, and a voltage is designed to be equal to or less than an allowable value in a band in which power impedance is defined, but the plurality of decoupling capacitors are disposed, thereby resulting in generating anti-resonance between the capacitors, and increasing impedance.

According to the related art, in order to solve this problem, a large number of decoupling capacitors are disposed, and a layout of the capacitors is changed, thereby achieving the desired characteristics.

However, in accordance with the high-performance capabilities of a portable terminal, as in a smartphone, a mounting space of the decoupling capacitor on a printed circuit board (PCB) may also be restricted, so there is a need to design the portable terminal so that a small number of elements is mounted therein.

Figure 14:
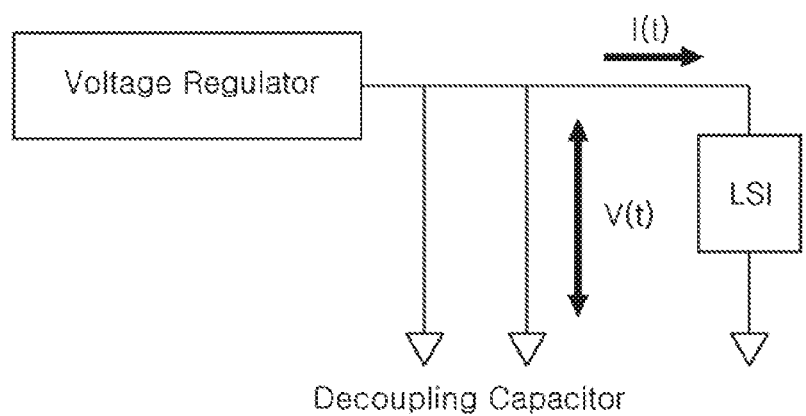
FIG. 14 is a circuit diagram schematically illustrating a case in which the multilayer capacitor according to the present disclosure is used as a decoupling capacitor in a LSI power supply circuit.
Figure 15:
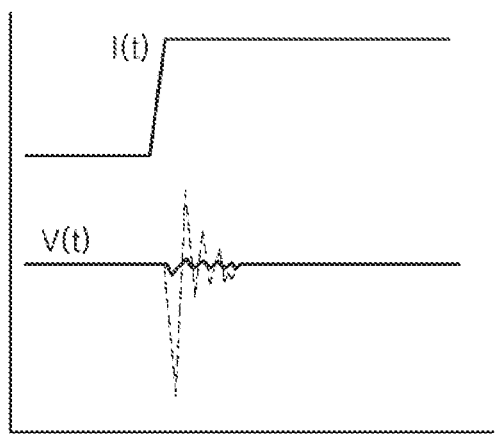
FIG. 15 is a graph illustrating a change in current and a voltage variation of the multilayer capacitor of FIG. 14.

FIG. 14 is a circuit diagram schematically illustrating a case in which the multilayer capacitor according to the present disclosure is used as a decoupling capacitor in a LSI power supply circuit; and FIG. 15 is a graph illustrating a change in current and a voltage variation of the multilayer capacitor of FIG. 14.

Referring to FIGS. 14 and 15, the decoupling capacitor may absorb a voltage variation generated by a rapid change of current flowing in the LSI and wiring inductance, thereby stabilizing a source voltage.

In a case of using the multilayer capacitor according to the exemplary embodiment in the present disclosure as the decoupling capacitor used in the LSI power supply circuit, it may be appreciated that voltage variation generated by the change in current and wiring inductance may be suitably absorbed with a single multilayer capacitor, due to its high capacitance and low ESL, as illustrated in FIG. 15.

As set forth above, according to exemplary embodiments in the present disclosure, low ESL characteristics may be significantly improved by decreasing the cross-sectional area of the current path, and capacitance of the capacitor may be increased by increasing the overlapping area between the first and second internal electrodes.

While exemplary embodiments have been shown and described above, it will be apparent to those skilled in the art that modifications and variations could be made without departing from the scope of the present invention, as defined by the appended claims.

What is claimed is:

1. A multilayer capacitor comprising:
   a ceramic body including a plurality of dielectric layers stacked to be disposed perpendicularly to a mounting surface of the ceramic body, and first and second internal electrodes alternately disposed, with respective dielectric layers interposed therebetween, the first and second internal electrodes being exposed to the mounting surface of the ceramic body and the first and second internal electrodes being exposed respectively to first and second end surfaces of the ceramic body, the first and second end surfaces opposing each other;
   first and second external electrodes disposed to be connected to the first and second internal electrodes respectively, at least a portion of the first external electrode being disposed on the first end surface and at least a portion of the second external electrode being disposed on the second end surface; and
   an insulating layer disposed on the mounting surface of the ceramic body and covering portions of the first and second internal electrodes exposed to the mounting surface but not in contact with the first and second external electrodes, the insulating layer being formed of a material different from that of the plurality of dielectric layers,
   wherein a portion of each of the first and second external electrodes contacting the insulating layer at the mounting surface has a three layer structure and each of the three layers contacts the mounting surface laterally adjacent to each other,
   the first and second internal electrodes are not exposed to a surface of the ceramic body opposing the mounting surface and connecting the first and second end surfaces, and
   wherein the insulating layer extends from the mounting surface of the ceramic body to portions of the end surfaces of the ceramic body in a length direction and to portions of side surfaces of the ceramic body in a width direction.

2. The multilayer capacitor of claim 1, wherein a distance between the first or second internal electrode and a surface of the ceramic body opposing the mounting surface of the ceramic body is greater than a thickness of the insulating layer.

3. The multilayer capacitor of claim 1, wherein a thickness of the insulating layer is 10 µm or less.

4. The multilayer capacitor of claim 1, wherein the first and second external electrodes include first and second electrode layers, first and second conductive resin layers, and first and second plating layers sequentially disposed on the ceramic body, respectively.

5. The multilayer capacitor of claim 1, wherein the first and second internal electrodes are exposed to opposing edges of the mounting surface of the ceramic body, respectively.

6. The multilayer capacitor of claim 1, wherein the first and second external electrodes extend from the mounting surface of the ceramic body to the end surfaces of the ceramic body opposing each other, respectively, and are disposed to be spaced apart from each other.

7. The multilayer capacitor of claim 1, wherein the insulating layer is formed of one of epoxy or ceramic slurry.

8. The multilayer capacitor of claim 1, wherein the ceramic body further includes covers disposed on both sides of outermost internal electrodes, respectively.

9. A board having a multilayer capacitor, the board comprising:
- a circuit board on which first and second electrode pads are formed; and
- the multilayer capacitor of claim 1, mounted on the circuit board so that the first and second external electrodes are disposed on the first and second electrode pads, respectively.

* * * * *